United States Patent
Nameda et al.

(10) Patent No.: US 10,209,562 B2
(45) Date of Patent: Feb. 19, 2019

(54) DISPLAY DEVICE

(71) Applicant: Funai Electric Co., Ltd., Daito-shi, Osaka (JP)

(72) Inventors: Makoto Nameda, Amagasaki (JP); Tomokazu Suzuki, Osaka (JP)

(73) Assignee: Funai Electric Co., Ltd., Daito-shi (JP)

( * ) Notice: Subject to any disclaimer, the term of this patent is extended or adjusted under 35 U.S.C. 154(b) by 472 days.

(21) Appl. No.: 14/402,336

(22) PCT Filed: Apr. 5, 2013

(86) PCT No.: PCT/JP2013/060449
§ 371 (c)(1),
(2) Date: Nov. 20, 2014

(87) PCT Pub. No.: WO2013/175875
PCT Pub. Date: Nov. 28, 2013

(65) Prior Publication Data
US 2015/0138759 A1    May 21, 2015

(30) Foreign Application Priority Data

May 23, 2012 (JP) .................. 2012-117100

(51) Int. Cl.
*H01L 33/58* (2010.01)
*G02F 1/1335* (2006.01)

(52) U.S. Cl.
CPC .. *G02F 1/133606* (2013.01); *G02F 1/133603* (2013.01); *G02F 1/133608* (2013.01);
(Continued)

(58) Field of Classification Search
CPC .... F21V 17/16; F21V 19/003; F21V 19/0035; F21V 17/102; F21V 17/10; F21V 17/14; F21V 17/164; F21V 17/06
See application file for complete search history.

(56) References Cited

U.S. PATENT DOCUMENTS 8,297,784 B2  10/2012 Ishio et al.
8,328,395 B2  12/2012 Kato et al.
(Continued)

FOREIGN PATENT DOCUMENTS

CN  102798002 A  * 11/2012  ............... F21V 5/04
EP  2 604 916 A1  6/2013
(Continued)

OTHER PUBLICATIONS

International Search Report dated Jun. 11, 2013 with English translation (four (4) pages).

*Primary Examiner* — Alexander K Garlen
*Assistant Examiner* — Colin J Cattanach
(74) *Attorney, Agent, or Firm* — Crowell & Moring LLP

(57) ABSTRACT

This display device includes a display portion, a light-emitting element emitting light to the display portion, a light-emitting element substrate (62) mounted with the light-emitting element, a supporting member (63) supporting the light-emitting element substrate (62), and a diffusing lens (64) provided to cover the light-emitting element, diffusing the light from the light-emitting element. The diffusing lens (64) integrally includes a first engaging portion (64a) configured to mount the diffusing lens (64) on the light-emitting element substrate (62) or the supporting member (63) and a first positioning portion (64b) provided separately from the first engaging portion (64a), configured to position the diffusing lens (64). The supporting member (63) includes a second engaging portion (63d) corresponding to the first engaging portion (64a) of the diffusing lens (64), and the light-emitting element substrate (62) includes a second positioning portion corresponding to the first positioning portion (64b) of the diffusing lens (64).

19 Claims, 9 Drawing Sheets

(52) U.S. Cl.
CPC ........... *G02F 2001/133607* (2013.01); *G02F 2001/133628* (2013.01); *H01L 33/58* (2013.01)

(56) References Cited

U.S. PATENT DOCUMENTS

| | | | |
|---|---|---|---|
| 8,596,829 B2 | 12/2013 | Yamaguchi | |
| 8,622,594 B2 | 1/2014 | Ishio et al. | |
| 8,632,200 B2 | 1/2014 | Takeuchi et al. | |
| 8,807,771 B2 | 8/2014 | Takeuchi et al. | |
| 8,833,979 B2* | 9/2014 | Wang | F21V 5/04 362/311.01 |
| 8,981,631 B2* | 3/2015 | Lin | G02B 6/003 313/110 |
| 9,116,386 B2* | 8/2015 | Ha | G02F 1/133603 |
| 2006/0044806 A1* | 3/2006 | Abramov | F21V 5/007 362/337 |
| 2006/0146531 A1* | 7/2006 | Reo | F21V 5/008 362/244 |
| 2007/0019409 A1* | 1/2007 | Nawashiro | F21V 5/04 362/231 |
| 2008/0062698 A1 | 3/2008 | Tai et al. | |
| 2008/0106897 A1* | 5/2008 | Yoon | G02B 3/0056 362/235 |
| 2008/0170400 A1* | 7/2008 | Maruyama | G02F 1/133603 362/294 |
| 2008/0210962 A1* | 9/2008 | Blumel | H01L 33/58 257/98 |
| 2008/0224159 A1* | 9/2008 | Krauter | H01L 33/58 257/98 |
| 2008/0231772 A1* | 9/2008 | Hung | F21V 5/04 349/65 |
| 2008/0266869 A1 | 10/2008 | Tai et al. | |
| 2008/0297020 A1* | 12/2008 | Wanninger | G02B 27/0927 313/110 |
| 2008/0298060 A1* | 12/2008 | Ohkawa | G02B 3/0056 362/240 |
| 2009/0091934 A1* | 4/2009 | Lin | F21K 9/00 362/294 |
| 2009/0175044 A1* | 7/2009 | Veenstra | F21V 17/164 362/368 |
| 2009/0213469 A1* | 8/2009 | Braune | B29C 45/1615 359/642 |
| 2010/0265721 A1* | 10/2010 | Zhou | F21K 9/00 362/311.01 |
| 2011/0032707 A1* | 2/2011 | Takashige | F21V 5/04 362/277 |
| 2011/0157901 A1* | 6/2011 | Chen | F21V 17/164 362/373 |
| 2012/0043560 A1* | 2/2012 | Wu | F21V 19/003 257/88 |
| 2012/0063133 A1 | 3/2012 | Takeuchi et al. | |
| 2012/0063150 A1* | 3/2012 | Takeuchi | G09F 9/33 362/308 |
| 2012/0081619 A1* | 4/2012 | Shimizu | G02F 1/133603 348/790 |
| 2012/0099026 A1* | 4/2012 | Yokota | G02B 19/0061 348/739 |
| 2012/0105763 A1 | 5/2012 | Takeuchi et al. | |
| 2012/0262906 A1* | 10/2012 | Wimbert | F21V 5/00 362/92 |
| 2013/0279173 A1 | 10/2013 | Takeuchi et al. | |
| 2014/0098520 A1 | 4/2014 | Takeuchi et al. | |
| 2014/0313733 A1 | 10/2014 | Takeuchi et al. | |
| 2015/0138759 A1 | 5/2015 | Nameda et al. | |

FOREIGN PATENT DOCUMENTS

| | | |
|---|---|---|
| JP | 6-38267 U | 5/1994 |
| JP | 6-38268 U | 5/1994 |
| JP | 2005-303157 A | 10/2005 |
| JP | 2007-35788 A | 2/2007 |
| JP | 3132536 U | 6/2007 |
| JP | 2009-49239 A | 3/2009 |
| JP | 2009-71186 A | 4/2009 |
| JP | 2010-276857 A | 12/2010 |
| JP | 2011-3549 A | 1/2011 |
| JP | 2011-18863 A | 1/2011 |
| JP | 2011-23176 A | 2/2011 |
| JP | 2011-34041 A | 2/2011 |
| JP | 2011-40376 A | 2/2011 |
| JP | 2011-44411 A | 3/2011 |
| JP | 2011-86569 A | 4/2011 |
| JP | 2012-4078 A | 1/2012 |
| JP | 2013-242499 A | 12/2013 |
| WO | WO 2010/146903 A1 | 12/2010 |
| WO | WO 2011/001752 A1 | 1/2011 |
| WO | WO 2011/046133 A1 | 4/2011 |

\* cited by examiner

DISPLAY DEVICE

TECHNICAL FIELD

The present invention relates to a display device, and more particularly, it relates to a display device including a diffusing lens diffusing light from a light-emitting element.

BACKGROUND ART

In general, a display device including a diffusing lens diffusing light from a light-emitting element is known. Such a display device is disclosed in Japanese Patent Laying-Open No. 2011-40376, for example.

In Japanese Patent Laying-Open No. 2011-40376, there is disclosed a screen light unit including light-emitting elements (LEDs), a substrate (light-emitting element substrate) mounted with a plurality of light-emitting elements, and an optical lens (diffusing lens) provided to cover the light-emitting elements, diffusing light from the light-emitting elements. This screen light unit is employed as a backlight of a display device. The optical lens of this screen unit is mounted on a flat surface (mounting surface) of the substrate mounted with the light-emitting elements through an adhesive material. Specifically, the optical lens is integrally provided with a plurality of supporting columns extending from the optical lens toward the substrate, and the plurality of these supporting columns and the surface of the substrate mounted with the light-emitting elements are bonded to each other through the adhesive material.

PRIOR ART

Patent Document

Patent Document 1: Japanese Patent Laying-Open No. 2011-40376

SUMMARY OF THE INVENTION

Problem to be Solved by the Invention

In the screen light unit disclosed in Japanese Patent Laying-Open No. 2011-40376, however, the optical lens (diffusing lens) is bonded to the surface (mounting surface) of the substrate (light-emitting element substrate) mounted with the light-emitting elements through the adhesive material, and hence there is conceivably such a problem that the optical lens is easily displaced before the adhesive material hardens. The time to harden the adhesive material is required, and hence there is conceivably such a problem that it takes a long time to mount the optical lens.

The present invention has been proposed in order to solve the aforementioned problem, and an object of the present invention is to provide a display device capable of suppressing displacement of a diffusing lens and reducing the time required to mount the diffusing lens.

Means for Solving the Problem

A display device according to an aspect of the present invention includes a display portion, a light-emitting element emitting light to the display portion, a light-emitting element substrate mounted with the light-emitting element, a supporting member supporting the light-emitting element substrate, and a diffusing lens provided to cover the light-emitting element, diffusing the light from the light-emitting element. The diffusing lens integrally includes a first engaging portion configured to mount the diffusing lens on the light-emitting element substrate or the supporting member and a first positioning portion provided separately from the first engaging portion, configured to position the diffusing lens. The light-emitting element substrate includes at least either a second engaging portion or a second positioning portion corresponding to the first engaging portion or the first positioning portion of the diffusing lens, and the supporting member includes at least either the second positioning portion or the second engaging portion.

In the display device according to the aspect of the present invention, as hereinabove described, the first positioning portion configured to position the diffusing lens is provided separately from the first engaging portion configured to mount the diffusing lens on the light-emitting element substrate or the supporting member, whereby displacement of the diffusing lens can be suppressed by the first positioning portion dedicated for positioning the diffusing lens. Furthermore, at least either the second engaging portion or the second positioning portion corresponding to the first engaging portion or the first positioning portion of the diffusing lens is provided in the light-emitting element substrate, and at least either the second positioning portion or the second engaging portion is provided in the supporting member, whereby the diffusing lens can be mounted on the light-emitting element substrate or the supporting member simply by fitting the first engaging portion and the first positioning portion of the diffusing lens into the second engaging portion and the second positioning portion of the light-emitting element substrate and/or the supporting member. Thus, the time to harden an adhesive material is not required unlike the case where the diffusing lens is bonded to the light-emitting element substrate or the supporting member through the adhesive material, and hence the time required to mount the diffusing lens can be reduced. Consequently, an operation of mounting the diffusing lens can be performed on the production line, and hence the display device suitable for mass production can be provided.

The aforementioned display device according to the aspect preferably further includes a reflective sheet reflecting the light from the light-emitting element toward the display portion, the reflective sheet is preferably arranged to be held between the diffusing lens and the light-emitting element substrate, and the diffusing lens preferably further includes an uplift suppressing portion configured to suppress uplift of the reflective sheet from the side of the light-emitting element substrate toward the diffusing lens. According to this structure, the uplift of the reflective sheet can be suppressed by the uplift suppressing portion even in the case where the reflective sheet between the diffusing lens and the light-emitting element substrate thermally expands or contracts.

In the aforementioned display device further including the reflective sheet, a forward end of the uplift suppressing portion closer to the light-emitting element substrate and the reflective sheet are preferably separated from each other with a clearance. According to this structure, contact of the forward end of the uplift suppressing portion closer to the light-emitting element substrate with the reflective sheet can be suppressed, and hence generation of a wrinkle in the reflective sheet originating from a portion where the reflective sheet and the forward end of the uplift suppressing portion closer to the light-emitting element substrate come into contact with each other can be suppressed.

In the aforementioned display device in which the forward end of the uplift suppressing portion and the reflective sheet are separated from each other, a separation distance between the forward end of the uplift suppressing portion and the reflective sheet is preferably not more than the thickness of the reflective sheet. According to this structure, the amount of uplift of the reflective sheet can be reduced to a tiny amount even if the reflective sheet arranged to be held between the diffusing lens and the light-emitting element substrate is slightly uplifted toward the uplift suppressing portion, and hence the reflective characteristics of the reflective sheet can be maintained.

In the aforementioned display device further including the reflective sheet, a plurality of uplift suppressing portions are preferably provided, and the plurality of uplift suppressing portions are preferably arranged oppositely to each other about the light-emitting element in a plan view. According to this structure, the uplift of the reflective sheet around the light-emitting element can be suppressed evenly (in a balanced manner) by the plurality of uplift suppressing portions arranged oppositely to each other about the light-emitting element.

In the aforementioned display device in which the diffusing lens further includes the uplift suppressing portion, the uplift suppressing portion is preferably provided in the form of a peripheral wall to surround the vicinity of the light-emitting element. According to this structure, the uplift of the reflective sheet in the vicinity of the light-emitting element can be effectively suppressed, and hence the amount of light reflected from the reflective sheet can be effectively increased.

In this case, the uplift suppressing portion is preferably provided to surround the vicinity of the light-emitting element in a state where a forward end of the form of the peripheral wall protrudes toward the light-emitting element substrate beyond a light-emitting surface of the light-emitting element. According to this structure, leakage of emission light from the light-emitting surface of the light-emitting element in the extensional transverse directions of the reflective sheet can be suppressed, and the emission light can be efficiently emitted to the display portion through the diffusing lens directly above the light-emitting surface.

In the aforementioned display device further including the reflective sheet, the reflective sheet preferably includes holes in portions corresponding to a portion where the first engaging portion and the second engaging portion engage with each other and a portion where the first positioning portion and the second positioning portion come into contact with each other. According to this structure, the portion of the first engaging portion engaging with the second engaging portion and the portion of the first positioning portion coming into contact with the second positioning portion pass through the holes of the reflective sheet, and hence the reflective sheet can be easily arranged between the diffusing lens and the light-emitting element substrate.

In this case, the first positioning portion is preferably formed in a columnar shape, and the size of the hole in the portion of the reflective sheet corresponding to the portion where the first positioning portion and the second positioning portion come into contact with each other is preferably larger than the outer shape of the first positioning portion in a plan view. According to this structure, contact of the reflective sheet with the columnar first positioning portion can be avoided in the portion where the first positioning portion and the second positioning portion come into contact with each other, and hence generation of a wrinkle in the reflective sheet can be suppressed in the portion where the first positioning portion and the second positioning portion come into contact with each other.

In the aforementioned display device according to the aspect, a pair of first engaging portions and a pair of first positioning portions are preferably provided in directions intersecting with each other. According to this structure, the diffusing lens can be stably mounted on the light-emitting element substrate or the supporting member by the pair of first engaging portions while the displacement of the diffusing lens is further suppressed by the pair of first positioning portions.

In the aforementioned display device according to the aspect, the second engaging portion is preferably provided in the supporting member, the second positioning portion is preferably provided in the light-emitting element substrate, the first engaging portion and the first positioning portion are preferably formed to protrude from the diffusing lens toward the supporting member and the light-emitting element substrate, respectively, and the second engaging portion and the second positioning portion preferably include a first engaging hole and a second engaging hole into which the first engaging portion and the first positioning portion are fitted, respectively. According to this structure, the diffusing lens can be mounted on a more stable member (supporting member) as compared with the case where the second engaging portion is provided in the light-emitting element substrate. Furthermore, the diffusing lens can be more accurately positioned with respect to the light-emitting element on the light-emitting element substrate as compared with the case where the second positioning portion is provided in the supporting member. In addition, the number of components can be reduced as compared with the case where the second engaging portion and the second positioning portion are provided separately from the supporting member and the light-emitting element substrate, respectively. Moreover, the diffusing lens can be easily mounted on the supporting member while the displacement of the diffusing lens with respect to the light-emitting element on the light-emitting element substrate is suppressed simply by fitting the first engaging portion and the first positioning portion into the first engaging hole and the second engaging hole, respectively.

In the aforementioned display device in which the first engaging portion protrudes from the diffusing lens toward the supporting member, the first engaging portion preferably has a hook shape tapered as the first engaging portion extends from the diffusing lens toward the supporting member. According to this structure, the first engaging portion tapers toward a forward end closer to the supporting member, so that the first engaging portion is easily fitted into the first engaging hole. Therefore, the time required to mount the diffusing lens can be further reduced.

In the aforementioned display device in which the first positioning portion protrudes from the diffusing lens toward the light-emitting element substrate, a step portion is preferably provided on a forward end of the first positioning portion closer to the light-emitting element substrate, the light-emitting element substrate preferably includes a mounting surface mounted with the light-emitting element, and the first positioning portion is preferably configured to serve not only as a positioning portion of the diffusing lens in a direction along the mounting surface but also as a positioning portion of the diffusing lens in a direction intersecting with the mounting surface by being fitted into the second engaging hole in a state where the step portion and the light-emitting element substrate come into contact with each other. According to this structure, the diffusing lens is positioned in the direction along the mounting surface of the light-emitting element substrate and in the direction intersecting with the mounting surface, and hence the displacement of the diffusing lens can be more effectively suppressed.

In this case, the step portion of the first positioning portion preferably has a bottom surface circumferentially coming into contact with the mounting surface of the light-emitting element substrate. According to this structure, the first positioning portion of the diffusing lens can be stably brought into contact with the mounting surface of the light-emitting element substrate through the circumferential bottom surface of the step portion, and hence the diffusing lens can be reliably positioned in the direction intersecting with the mounting surface of the light-emitting element substrate.

In the aforementioned display device in which the step portion is provided on the forward end of the first positioning portion, the diffusing lens is preferably configured to be held on the mounting surface of the light-emitting element substrate in a state where the first engaging portion is fitted into the first engaging hole of the supporting member to engage with the supporting member and the first positioning portion is fitted into the second engaging hole of the light-emitting element substrate so that the step portion comes into contact with the mounting surface. According to this structure, the diffusing lens can be easily fixed to a prescribed position on the light-emitting element substrate to cover the light-emitting element.

In the aforementioned display device in which the first positioning portion protrudes from the diffusing lens toward the light-emitting element substrate, the supporting member is preferably configured to support the light-emitting element substrate on the lower side of the light-emitting element substrate opposite to a side on which the diffusing lens covers the light-emitting element, and the protrusion length of the first engaging portion from the diffusing lens toward the supporting member is preferably larger than the protrusion length of the first positioning portion from the diffusing lens toward the light-emitting element substrate. According to this structure, the diffusing lens can be easily mounted on the light-emitting element substrate and the supporting member in a state where the diffusing lens is arranged at the prescribed position on the light-emitting element substrate to cover the light-emitting element.

In the aforementioned display device in which the second engaging portion is provided in the supporting member and the second positioning portion is provided in the light-emitting element substrate, the light-emitting element substrate is preferably formed to extend along a prescribed direction, a pair of first engaging portions are preferably provided on both sides of the diffusing lens in a direction intersecting with the extensional direction of the light-emitting element substrate and are preferably configured to engage with the second engaging portion of the supporting member, and a pair of first positioning portions are preferably provided on both sides of the diffusing lens in the extensional direction of the light-emitting element substrate and are preferably configured to come into contact with the second positioning portion of the light-emitting element substrate. According to this structure, the diffusing lens can be easily mounted on the supporting member by the pair of first engaging portions provided on both sides of the diffusing lens in the direction intersecting with the extensional direction of the light-emitting element substrate. Furthermore, the diffusing lens can be easily positioned with respect to the light-emitting element on the light-emitting element substrate by the pair of first positioning portions provided on both sides of the diffusing lens in the extensional direction of the light-emitting element substrate.

In this case, the diffusing lens is preferably configured to engage with the second engaging portion of the supporting member in a state where the pair of first engaging portions stride the light-emitting element substrate along the direction intersecting with the extensional direction of the light-emitting element substrate. According to this structure, the first engaging portion can be engaged with the second engaging portion of the supporting member supporting the light-emitting element substrate without bringing the first engaging portion into contact with the light-emitting element substrate.

In the aforementioned display device in which the light-emitting element substrate is formed to extend along the prescribed direction, a plurality of diffusing lenses are preferably provided, and the plurality of diffusing lenses are preferably arranged in the form of a row at a prescribed interval along the prescribed direction in which the light-emitting element substrate extends. According to this structure, the time required to mount the diffusing lens can be effectively reduced even in the case where the plurality of diffusing lenses are mounted on the light-emitting element substrate and the supporting member, and hence the mass production efficiency of the display device can be improved.

In the aforementioned display device according to the aspect, the supporting member preferably includes a heat radiating member radiating heat transferred from the light-emitting element through the light-emitting element substrate. According to this structure, heat generated by causing the light-emitting element to emit light can be easily radiated by the heat radiating member.

Effects of the Invention

According to the present invention, as hereinabove described, the displacement of the diffusing lens can be suppressed, and the time required to mount the diffusing lens can be reduced.

MODES FOR CARRYING OUT THE INVENTION

Embodiments of the present invention are hereinafter described on the basis of the drawings.

First Embodiment

The structure of a liquid crystal television set 100 according to a first embodiment of the present invention is now described with reference to FIGS. 1 to 11. The liquid crystal television set 100 is an example of the "display device" in the present invention.

Figure 1:
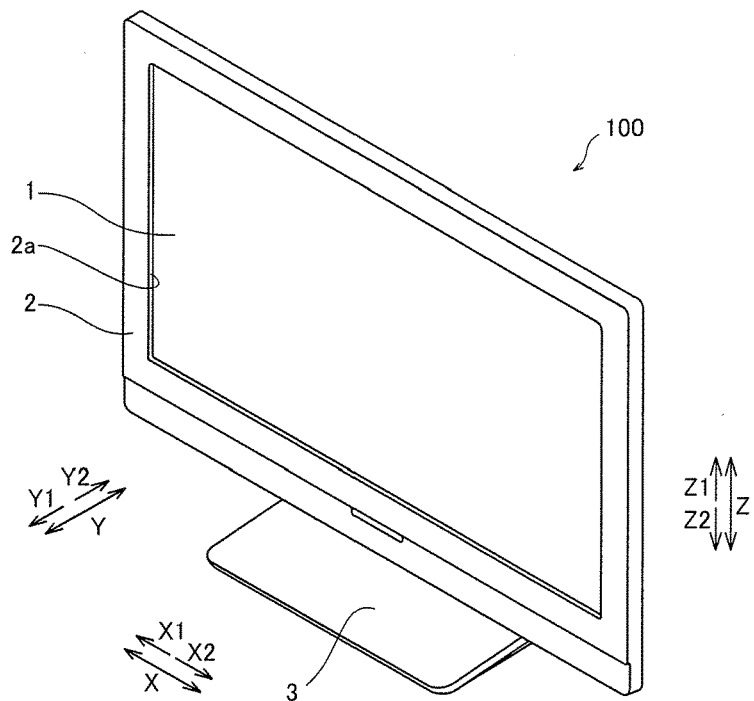
FIG. 1 A perspective view showing the overall structure of a liquid crystal television set according to a first embodiment.
Figure 2:
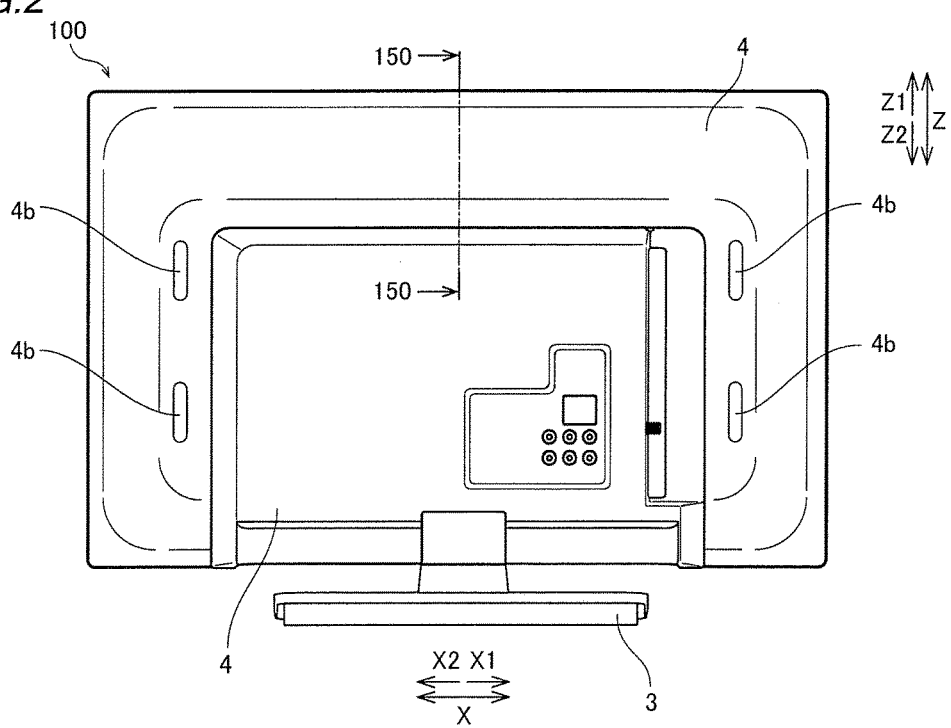
FIG. 2 A rear elevational view of the liquid crystal television set shown in FIG. 1.
Figure 3:
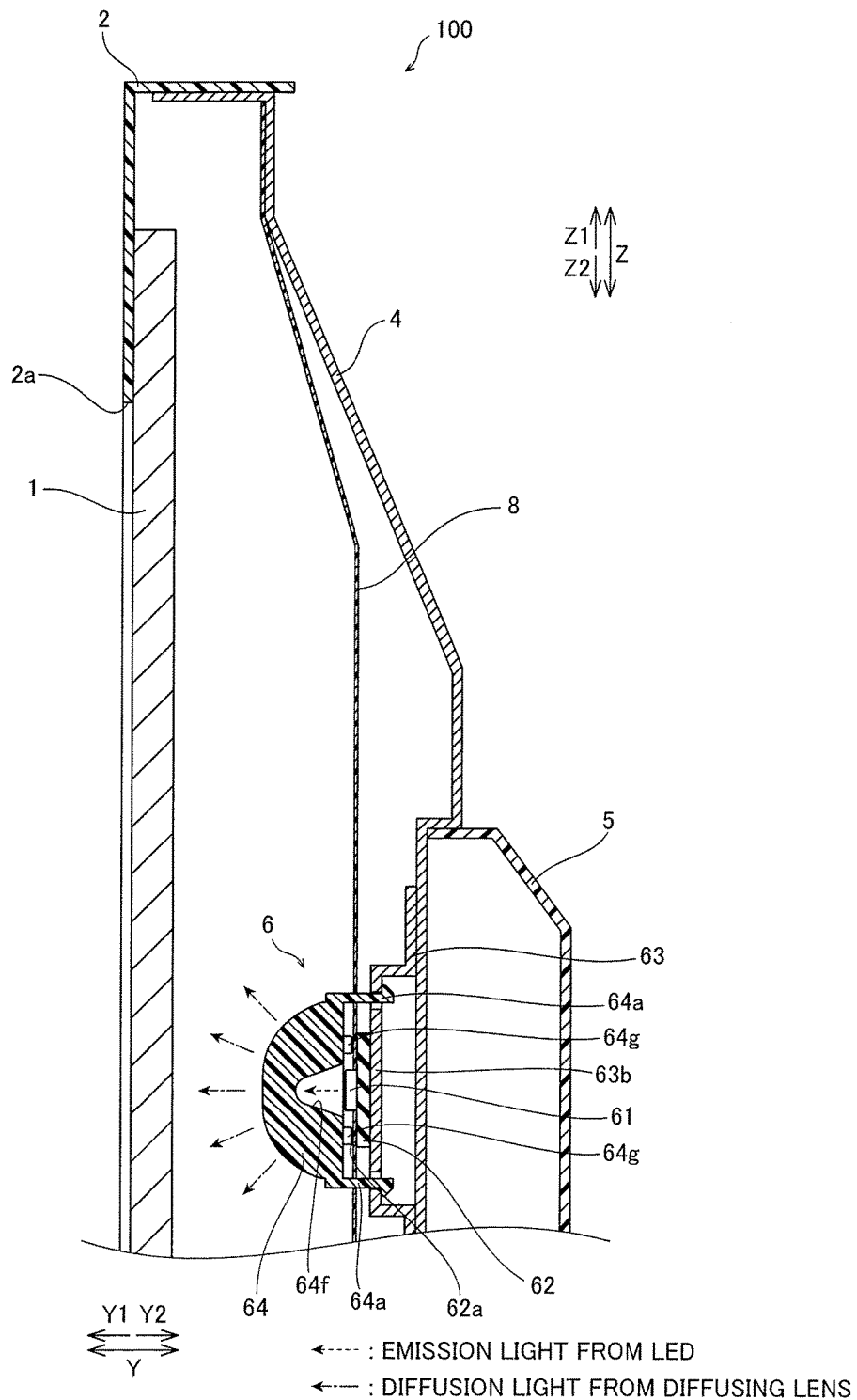
FIG. 3 A schematic sectional view taken along the line 150-150 in FIG. 2.

As shown in FIGS. 1 and 2, the liquid crystal television set 100 includes a display portion 1 including a liquid crystal cell on which a picture is displayed, a front housing 2 made of resin, supporting the display portion 1 from the front side (arrow Y1 direction side), and a stand member 3 made of resin, supporting the liquid crystal television set 100 from below (arrow Z2 direction side). The front housing 2 is in the form of a frame having a rectangular outer shape as viewed from the front side (as viewed from the arrow Y1 direction side). Specifically, a rectangular opening 2a for exposing the display portion 1 is provided in the vicinity of a central portion of the front housing 2. As shown in FIG. 3, the front housing 2 is in the form of a recess recessed forward (in an arrow Y1 direction).

As shown in FIGS. 2 and 3, the liquid crystal television set 100 includes a rear frame 4 made of sheet metal, supporting the display portion 1 from the rear side (arrow Y2 direction side). This rear frame 4 has a rectangular outer shape fitted into the rear side of the front housing 2. The rear frame 4 is in the form of a recess recessed rearward (in an arrow Y2 direction). The rear frame 4 is fixed to the front housing 2 by screw members (not shown). A cover member 5 made of resin, having a rectangular shape smaller than that of the rear frame 4 is arranged on the rear side of the rear frame 4. The cover member 5 is provided to cover various substrates such as a signal processing substrate (not shown) arranged on the rear surface of the rear frame 4. The cover member 5 is fixed to the rear frame 4 by screw members (not shown). These rear frame 4 and cover member 5 constitute a rear housing corresponding to the front housing 2. The rear frame 4 is an example of the "supporting member" in the present invention.

According to the first embodiment, a backlight portion 6 including LEDs (light emitting diodes) 61 emitting light from the rear side (arrow Y2 direction side) to the display portion 1 is arranged between the rear surface (a surface in an arrow Y2 direction) of the front housing 2 and the front surface (a surface on the arrow Y1 direction side) of the rear frame 4, as shown in FIG. 3. The LEDs 61 are examples of the "light-emitting element" in the present invention. Although not shown in FIG. 3, various optical sheets such as a diffusing sheet diffusing light from the backlight portion 6 toward the display portion 1 are arranged between the display portion 1 and the backlight portion 6.

As shown in FIG. 3, the backlight portion 6 includes the LEDs 61 serving as a light source, substrates 62 made of glass epoxy, mounted with the LEDs 61, heat sinks 63 made of sheet metal (sheet metal of iron or aluminum), supporting the substrates 62, and diffusing lenses 64 made of acrylic or polycarbonate, diffusing (see one-dot chain lines with arrows in FIG. 3) light (see a dotted line with an arrow in FIG. 3) from the LEDs 61 toward the display portion 1. The sixteen (8×2 rows) diffusing lenses 64 in total are provided in the backlight portion 6, and the diffusing lenses 64 are arranged in the form of a row (linearly) at prescribed intervals along the extensional direction (direction X) of the substrates 62. The substrates 62 are examples of the "light-emitting element substrate" in the present invention. The heat sinks 63 are examples of the "supporting member" or the "heat radiating member" in the present invention.

Figure 4:
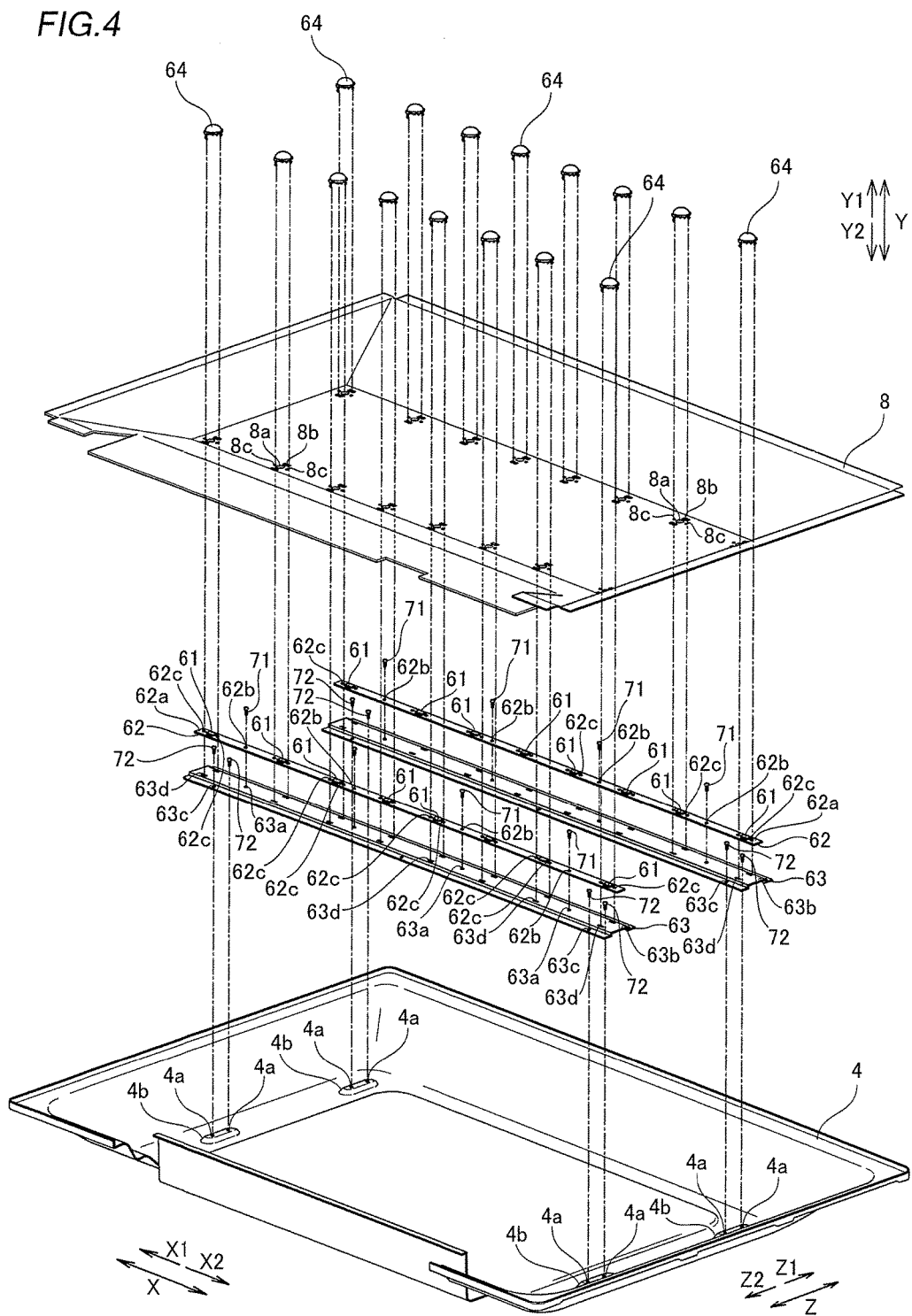
FIG. 4 An exploded perspective view showing a rear frame, heat sinks, LED substrates, a reflective sheet, and diffusing lenses according to the first embodiment.

As shown in FIG. 4, the substrates 62 are formed to extend along a prescribed direction (the longitudinal direction of the rear frame 4: direction X). Two substrates 62 are provided at an interval along the short-side direction (direction Z) of the rear frame 4. A plurality of LEDs 61 are mounted on surfaces (surfaces on the arrow Y1 direction side) of the two substrates 62 extending along the direction X at intervals in the direction X. The surfaces of the substrates 62 mounted with the LEDs 61 are hereinafter referred to as mounting surfaces 62a.

Figure 5:
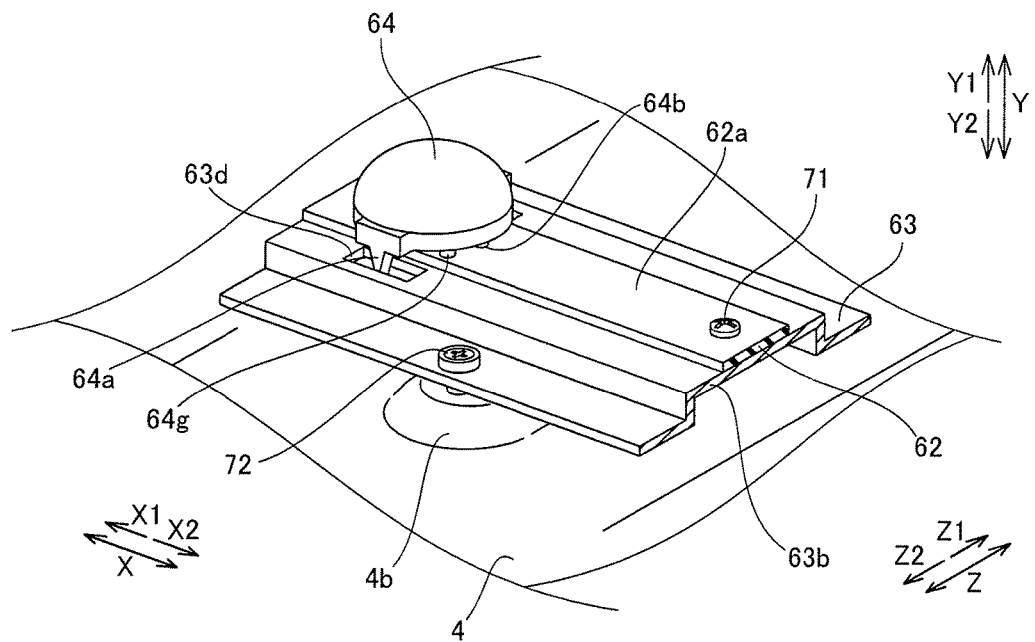
FIG. 5 An enlarged perspective view showing a state where the rear frame, a heat sink, an LED substrate, and a diffusing lens shown in FIG. 4 are coupled to each other.

As shown in FIGS. 4 and 5, the substrates 62 are fixed to surfaces (surfaces on the arrow Y1 direction side) of the heat sinks 63 by screw members 71. Specifically, a plurality of screw insertion holes 62b into which the screw members 71 are inserted are provided at intervals along the extensional direction (direction X) of the substrates 62 in the substrates 62, as shown in FIG. 4. Furthermore, screw holes 63a fitted with the screw members 71 are provided at positions of the surfaces of the heat sinks 63 corresponding to the plurality of screw insertion holes 62b of the aforementioned substrates 62.

As shown in FIGS. 3 to 5, the heat sinks 63 are arranged between the front surface (the surface on the arrow Y1 direction side) of the rear frame 4 and the rear surfaces (surfaces on the arrow Y2 direction side) of the substrates 62 opposite to the mounting surfaces 62a. These heat sinks 63 are configured to radiate heat transferred from the LEDs 61 through the substrates 62 toward the rear frame 4. The heat sinks 63 are formed to extend along the longitudinal direction (direction X) of the rear frame 4, similarly to the substrates 62, and two heat sinks 63 are provided at an interval along the short-side direction (direction Z) of the rear frame 4. The heat sinks 63 have projecting portions 63b protruding toward a side (arrow Y1 direction side) opposite to the rear frame 4. These projecting portions 63b are formed to extend in the direction X in the vicinity of central portions of the heat sinks 63 in the direction Z. Surfaces (surfaces on the arrow Y1 direction side) of the projecting portions 63b are flattened. Therefore, the heat sinks 63 have a function of supporting the substrates 62 on the lower side (arrow Y2 direction side) of the substrates 62 opposite to a side on which the diffusing lenses 64 cover the LEDs 61, as shown in FIG. 3.

As shown in FIGS. 4 and 5, the heat sinks 63 are fixed to the surface (the surface on the arrow Y1 direction side) of the rear frame 4 by screw members 72. Specifically, screw insertion holes 63c into which the screw members 72 are inserted are provided in the vicinity of both ends of the heat sinks 63 in the direction X, as shown in FIG. 4. Screw holes 4a fitted with the screw members 7 are provided at positions of the surface of the rear frame 4 corresponding to the screw insertion holes 63c of the aforementioned heat sinks 63. Two screw holes 4a are provided in each of a plurality of projecting portions 4b provided in the vicinity of both ends in the longitudinal direction (direction X) of the bottom surface (a surface extending in the direction X and the direction Z) of the rear frame 4.

As shown in FIGS. 3 to 5, a plurality of diffusing lenses 64 are provided to cover the plurality of LEDs 61 mounted on the mounting surfaces 62a of the substrates 62. In FIG. 5, illustration of a reflective sheet 8 described later, arranged between the diffusing lenses 64 and the substrates 62 is omitted for the convenience of illustration. According to the first embodiment, the diffusing lenses 64 are formed to integrally include engaging portions 64a configured to mount the diffusing lenses 64 on the heat sinks 63 and positioning portions 64b configured to position the diffusing lenses 64, as shown in FIGS. 3 to 11. The engaging portions 64a and the positioning portions 64b are examples of the "first engaging portion" and the "first positioning portion" in the present invention, respectively.

Figure 6:
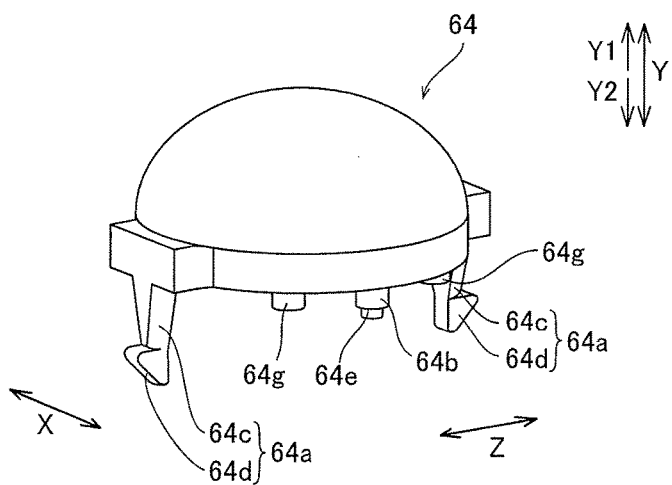
FIG. 6 A perspective view showing the overall structure of the diffusing lens according to the first embodiment.
Figure 7:
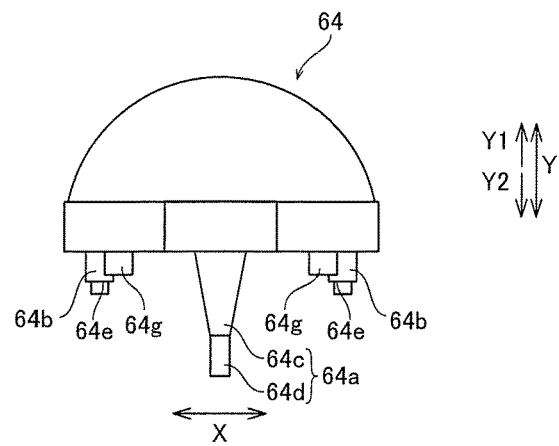
FIG. 7 A side elevational view of the diffusing lens shown in FIG. 6 as viewed in a direction Z.
Figure 8:
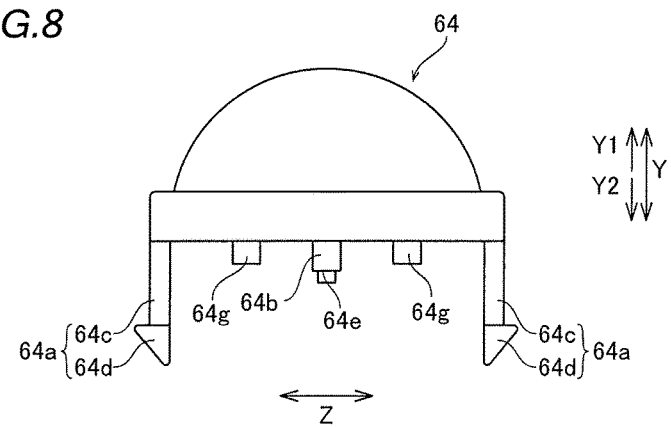
FIG. 8 A side elevational view of the diffusing lens shown in FIG. 6 as viewed in a direction X.
Figure 9:
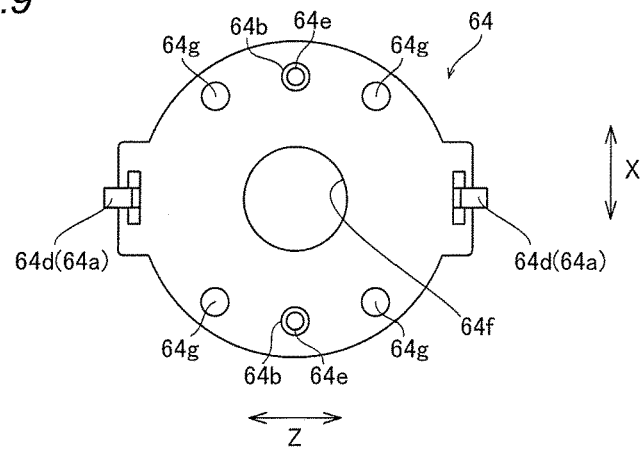
FIG. 9 A bottom plan view of the diffusing lens shown in FIG. 6 as viewed along arrow Y2.
Figure 10:
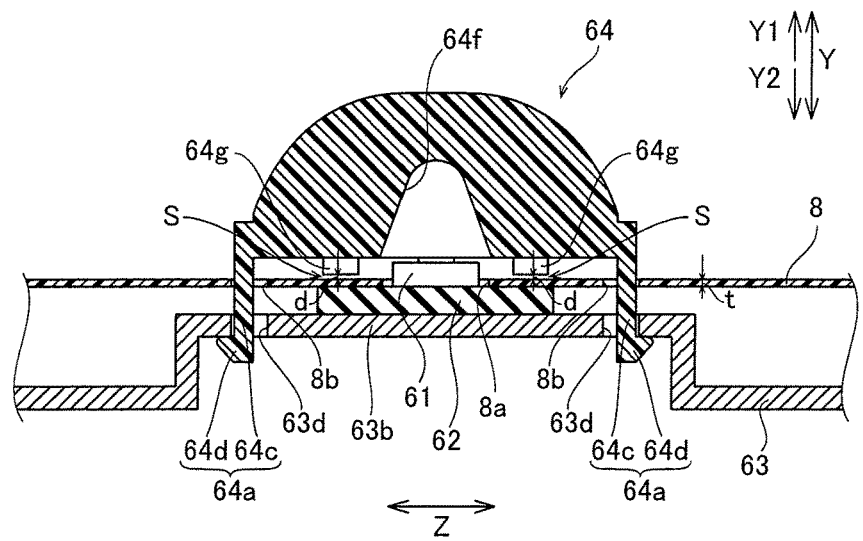
FIG. 10 An enlarged sectional view showing a state where engaging portions of the diffusing lens and engaging holes of the heat sink according to the first embodiment engage with each other.
Figure 11:
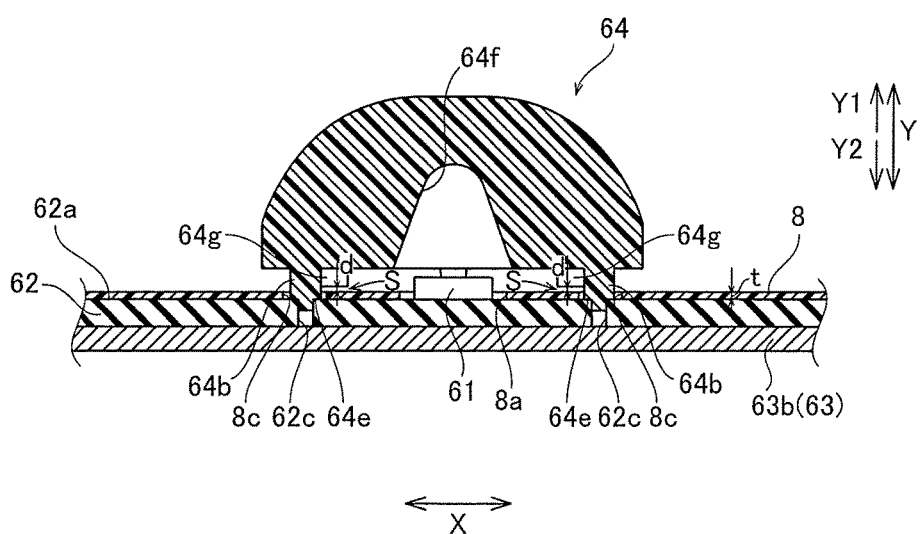
FIG. 11 An enlarged sectional view showing a state where positioning portions of the diffusing lens and positioning holes of the substrate according to the first embodiment come into contact with each other.

As shown in FIGS. 6 to 11, the engaging portions 64a are formed to protrude from the bottom surfaces (surfaces on the arrow Y2 direction side) of the diffusing lenses 64 toward the heat sinks 63 (arrow Y2 direction side). As shown in FIGS. 6 and 7, the engaging portions 64a each have a hook shape tapered as the engaging portions 64a extend from the diffusing lenses 64 toward the heat sinks 63. Specifically, the engaging portions 64a include columnar portions 64c each having a rectangular cross-section extending to taper from the bottom surfaces of the diffusing lenses 64 toward the heat sinks 63 and hook portions 64d each having a rectangular cross-section, provided at forward ends of the columnar portions 64c closer to the heat sinks 63. As shown in FIGS. 5, 10, and 11, the hook portions 64d of the engaging portions 64a are configured to be fitted into engaging holes 63d (rectangular holes corresponding to the engaging portions 64a) provided in the heat sinks 63 for engagement. These engaging holes 63d are arranged in regions (regions in the vicinity of both ends in the direction Z) of the projecting portions 63b where the substrates 62 are not arranged. The engaging holes 63d are examples of the "second engaging portion" or the "first engaging hole" in the present invention.

As shown in FIGS. 6 to 11, the positioning portions 64b are formed to protrude from the bottom surfaces (the surfaces on the arrow Y2 direction side) of the diffusing lenses 64 toward the substrates 62 (arrow Y2 direction side). Specifically, the positioning portions 64b each have a columnar shape extending from the diffusing lenses 64 toward the substrates 62. Forward ends of the positioning portions 64b closer to the substrates 62 are provided with step portions 64e. The step portions 64e have bottom surfaces (lower surfaces on the arrow Y2 direction side) circumferentially coming into contact with the mounting surfaces 62a of the substrates 62. As shown in FIGS. 10 and 11, the forward ends of the positioning portions 64b closer to the substrates 62 are configured to be fitted into positioning holes 62c (circular holes corresponding to the positioning portions 64b) provided in the substrates 62 for engagement in a state where these step portions 64e circumferentially come into contact with the mounting surfaces 62a of the substrates 62. Thus, the positioning portions 64b are configured to serve not only as positioning portions of the diffusing lenses 64 in directions (the direction X and the direction Z: the horizontal directions of the diffusing lenses 64) along the substrates 62 but also as positioning portions of the diffusing lenses 64 in a direction (the direction Y: the height direction of the diffusing lenses 64) intersecting with the substrates 62.

As shown in FIGS. 10 and 11, the protrusion length (length in an arrow Y2 direction) of the engaging portions 64a from the lower surfaces of the diffusing lenses 64 toward the heat sinks 63 is larger than the protrusion length of the positioning portions 64b from the lower surfaces of the diffusing lenses 64 toward the substrates 62. Therefore, the diffusing lenses 64 are held on the mounting surfaces 62a of the substrates 62 in a state where the engaging portions 64a are fitted into the engaging holes 63d of the heat sinks 63 to engage with the heat sinks 63 and the positioning portions 64b are fitted into the positioning holes 62c of the substrates 62 so that the step portions 64e come into contact with the mounting surfaces 62a. The positioning holes 62c are examples of the "second positioning portion" or the "second engaging hole" in the present invention.

As shown in FIGS. 6 to 9, the engaging portions 64a and the positioning portions 64b are provided on the bottom surfaces (the surfaces on the arrow Y2 direction side) of the diffusing lenses 64 separately from each other. Specifically, a pair of engaging portions 64a and a pair of positioning portions 64b are provided in directions (the direction Z and the direction X) intersecting with each other (orthogonal to each other) on each of the bottom surfaces of the diffusing lenses 64, as shown in FIG. 9. In other words, the pair of engaging portions 64a are provided at positions symmetrical in the direction Z (a direction intersecting with the extensional direction (direction X) of the substrates 62) with respect to a concave hole 64f provided in a central portion of each of the bottom surfaces of the diffusing lenses 64. The pair of positioning portions 64b are provided at positions symmetrical in the direction X (the extensional direction of the substrates 62) with respect to the hole 64f in the central portion of each of the bottom surfaces of the diffusing lenses 64. As shown in FIG. 5, the diffusing lenses 64 each are configured to engage with the engaging holes 63d of a heat sink 63 in a state where the pair of engaging portions 64a stride a substrate 62 along the direction (direction Z) intersecting with (orthogonal to) the extensional direction (direction X) of the substrate 62.

According to the first embodiment, the reflective sheet 8 made of PET (polyethylene terephthalate), reflecting the light from the LEDs 61 toward the display portion 1 (arrow Y1 direction side) is provided between the rear surface (the surface in the arrow Y2 direction) of the front housing 2 and the front surface of the rear frame 4 and the front surface (the surface on the arrow Y1 direction side) of the rear frame 4, as shown in FIG. 3. This reflective sheet 8 is arranged to be held between the diffusing lenses 64 and the substrates 62. As shown in FIGS. 4, 10, and 11, the reflective sheet 8 includes holes 8a, 8b, and 8c in portions corresponding to the LEDs 61 mounted on the mounting surfaces 62a (the surfaces on the arrow Y1 direction side) of the substrates 62, portions corresponding to portions where the engaging portions 64a of the diffusing lenses 64 and the engaging holes 63d of the heat sinks 63 engage with each other, and portions corresponding to portions where the positioning portions 64b of the diffusing lenses 64 and the positioning holes 62c of the substrates 62 come into contact with each other, respectively. The size of the holes 8c (see FIG. 11) in the portions of the reflective sheet 8 corresponding to the portions where the positioning portions 64b and the positioning holes 62c come into contact with each other is larger than the outer shape (diameter) of the positioning portions 64b in a plan view. Therefore, the positioning portions 64b come into contact with the positioning holes 62c in a state where the same are not in contact with the inner peripheral surfaces of the holes 8c of the reflective sheet 8.

As shown in FIGS. 6 to 11, the diffusing lenses 64 integrally include uplift suppressing portions 64g configured to suppress uplift of the reflective sheet 8 from the side of the substrates 62 toward the diffusing lenses 64. These uplift suppressing portions 64g each have a columnar shape extending from the diffusing lenses 64 toward the substrates (arrow Y2 direction side). As shown in FIG. 9, the uplift suppressing portions 64g are provided one by one between the pair of engaging portions 64a and the pair of positioning portions 64b provided on each of the bottom surfaces of the diffusing lenses 64. In other words, a plurality of (four in FIG. 9) uplift suppressing portions 64g are provided to circumferentially surround the hole 64f in the central portion of each of the bottom surfaces (the surfaces on the arrow Y2 direction side) of the diffusing lenses 64 in the plan view. Therefore, the uplift suppressing portions 64g have a positional relationship in which the uplift suppressing portions 64g are arranged oppositely (diagonally) to each other about an LED 61 (see FIG. 10). As shown in FIG. 10, clearances S each having a separation interval d (about 0.2 mm) not more than the thickness t (at least about 0.2 mm and not more than about 0.3 mm) of the reflective sheet 8 are provided between forward ends of the uplift suppressing portions 64g closer to the substrates 62 and a surface (a surface on the arrow Y1 direction side) of the reflective sheet 8.

According to the first embodiment, as hereinabove described, the positioning portions 64b configured to position the diffusing lenses 64 are provided separately from the engaging portions 64a configured to mount the diffusing lenses 64 on the substrates 62 or the heat sinks 63, whereby displacement of the diffusing lenses 64 can be suppressed by the positioning portions 64b dedicated for positioning the diffusing lenses 64. Furthermore, the engaging holes 63d and the positioning holes 62c corresponding to the engaging portions 64a and the positioning portions 64b of the diffusing lenses 64 are provided in the heat sinks 63 and the substrates 62, respectively, whereby the diffusing lenses 64 can be mounted on the substrates 62 and the heat sinks 63 simply by fitting the engaging portions 64a and the positioning portions 64b of the diffusing lenses 64 into the engaging holes 63d of the heat sinks 63 and the positioning holes 62c of the substrates 62, respectively. Thus, the time to harden an adhesive material is not required unlike the case where the diffusing lenses 64 are bonded to the substrates 62 or the heat sinks 63 through the adhesive material, and hence the time required to mount the diffusing lenses 64 can be reduced. Consequently, an operation of mounting the diffusing lenses 64 can be performed on the production line, and hence the liquid crystal television set 100 suitable for mass production can be provided.

According to the first embodiment, as hereinabove described, the reflective sheet 8 is arranged to be held between the diffusing lenses 64 and the substrates 62, and the uplift suppressing portions 64g configured to suppress the uplift of the reflective sheet 8 from the side of the substrates 62 toward the diffusing lenses 64 (arrow Y1 direction side) are provided in the diffusing lenses 64. Thus, the uplift of the reflective sheet 8 can be suppressed by the uplift suppressing portions 64g even in the case where the reflective sheet 8 between the diffusing lenses 64 and the substrates 62 thermally expands or contracts.

According to the first embodiment, as hereinabove described, the clearances S are provided between the forward ends of the uplift suppressing portions 64g closer to the substrates 62 (arrow Y2 direction side) and the reflective sheet 8. Thus, contact of the forward ends of the uplift suppressing portions 64g closer to the substrates 62 with the reflective sheet 8 can be suppressed, and hence generation of a wrinkle in the reflective sheet 8 originating from portions where the reflective sheet 8 and the forward ends of the uplift suppressing portions 64g closer to the substrates 62 come into contact with each other can be suppressed.

According to the first embodiment, as hereinabove described, the separation distance d between the forward ends of the uplift suppressing portions 64g and the reflective sheet 8 is not more than the thickness t of the reflective sheet 8. Thus, the amount of uplift of the reflective sheet 8 can be reduced to a tiny amount even if the reflective sheet 8 arranged to be held between the diffusing lenses 64 and the substrates 62 is slightly uplifted toward the uplift suppressing portions 64g (arrow Y1 direction side), and hence the reflective characteristics of the reflective sheet 8 can be maintained.

According to the first embodiment, as hereinabove described, the plurality of (four) uplift suppressing portions 64g are provided in each of the diffusing lenses 64, and the four uplift suppressing portions 64g are arranged oppositely to each other about the LED 61 in the plan view. Thus, the uplift of the reflective sheet 8 around the LED 61 can be suppressed evenly (in a balanced manner) by the four uplift suppressing portions 64g in total arranged oppositely to each other about the LED 61.

According to the first embodiment, as hereinabove described, the holes 8b and 8c are provided in the portions of the reflective sheet 8 corresponding to the portions where the engaging portions 64a and the engaging holes 63d engage with each other and the portions where the positioning portions 64b and the positioning holes 62c come into contact with each other, respectively. Thus, the portions (hook portions 64d) of the engaging portions 64a engaging with the engaging holes 63d and the portions (step portions 64e) of the positioning portions 64b coming into contact with the positioning holes 62c pass through the holes 8b and 8c of the reflective sheet 8, respectively, and hence the reflective sheet 8 can be easily arranged between the diffusing lenses 64 and the substrates 62.

According to the first embodiment, as hereinabove described, the positioning portions 64b each have the columnar shape, and the size of the holes 8c in the portions of the reflective sheet 8 corresponding to the portions where the positioning portions 64b and the positioning holes 62c come into contact with each other is larger than the outer shape (diameter) of the positioning portions 64b in the plan view. Thus, contact of the reflective sheet 8 with the columnar positioning portions 64b can be avoided in the portions where the positioning portions 64b and the positioning holes 62c come into contact with each other, and hence generation of a wrinkle in the reflective sheet 8 can be suppressed in the portions where the positioning portions 64b and the positioning holes 62c come into contact with each other.

According to the first embodiment, as hereinabove described, the pair of engaging portions 64a and the pair of positioning portions 64b are provided in the directions (the direction Z and the direction X) intersecting with (orthogonal to) each other. Thus, the diffusing lenses 64 can be stably mounted on the substrates 62 or the heat sinks 63 by the pair of engaging portions 64a while the displacement of each of the diffusing lenses 64 is further suppressed by the pair of positioning portions 64b.

According to the first embodiment, as hereinabove described, the engaging holes 63d are provided in the heat sinks 63, and the positioning holes 62c are provided in the substrates 62. Thus, the diffusing lenses 64 can be mounted on more stable members (heat sinks 63) as compared with the case where the engaging holes 63d are provided in the substrates 62. Furthermore, the diffusing lenses 64 can be more accurately positioned with respect to the LEDs 61 on the substrates 62 as compared with the case where the positioning holes 62c are provided in the heat sinks 63. In addition, the number of components can be reduced as compared with the case where the engaging holes 63d and the positioning holes 62c are provided separately from the heat sinks 63 and the substrates 62, respectively.

According to the first embodiment, as hereinabove described, the engaging portions 64a and the positioning portions 64b are formed to protrude from the diffusing lenses 64 toward the heat sinks 63 and the substrates 62 (arrow Y2 direction side), respectively, and the engaging holes 63d and the positioning holes 62c into which the engaging portions 64a and the positioning portions 64b are fitted are provided in the heat sinks 63 and the substrates 62, respectively. Thus, the diffusing lenses 64 can be easily mounted on the heat sinks 63 while the displacement of the diffusing lenses 64 with respect to the LEDs 61 on the substrates 62 is suppressed simply by fitting the engaging portions 64a and the positioning portions 64b into the engaging holes 63d and the positioning holes 62c, respectively.

According to the first embodiment, as hereinabove described, the engaging portions 64a each are formed in the hook shape tapered as the engaging portions 64a extend from the diffusing lenses 64 toward the heat sinks 63 (arrow Y2 direction side). Thus, the engaging portions 64a taper toward forward ends closer to the heat sinks 63, so that the engaging portions 64a are easily fitted into the engaging holes 63d. Therefore, the time required to mount the diffusing lenses 64 can be further reduced.

According to the first embodiment, as hereinabove described, the step portions 64e provided in the forward ends of the positioning portions 64b closer to the substrates 62 (arrow Y2 direction side), and the positioning portions 64b are configured to be fitted into the positioning holes 62c in a state where the step portions 64e and the substrates 62 come into contact with each other. Thus, the diffusing lenses 64 are positioned in the directions (the direction X and the direction Z: the horizontal directions of the diffusing lenses 64) along the mounting surfaces 62a (the surfaces on the arrow Y1 direction side) of the substrates 62 and in the direction (the direction Y: the height direction of the diffusing lenses 64) intersecting with the mounting surfaces 62a, and hence the displacement of the diffusing lenses 64 can be more effectively suppressed.

According to the first embodiment, as hereinabove described, the bottom surfaces (the lower surfaces on the arrow Y2 direction side) circumferentially coming into contact with the mounting surfaces 62a of the substrates 62 are provided on the step portions 64e of the positioning portions 64b. Thus, the positioning portions 64b of the diffusing lenses 64 can be stably brought into contact with the mounting surfaces 62a of the substrates 62 through the circumferential bottom surfaces of the step portions 64e, and hence the diffusing lenses 64 can be reliably positioned in the direction (the direction Y: the height direction of the diffusing lenses 64) intersecting with the mounting surfaces 62a of the substrates 62.

According to the first embodiment, as hereinabove described, the diffusing lenses 64 are configured to be held on the mounting surfaces 62a of the substrates 62 in the state where the engaging portions 64a are fitted into the engaging holes 63d of the heat sinks 63 to engage with the heat sinks 63 and the positioning portions 64b are fitted into the positioning holes 62c of the substrates 62 so that the step portions 64e come into contact with the mounting surfaces 62a. Thus, the diffusing lenses 64 can be easily fixed to prescribed positions on the substrates 62 to cover the LEDs 61.

According to the first embodiment, as hereinabove described, the heat sinks 63 are configured to support the substrates 62 on the lower side (arrow Y2 direction side) of the substrates 62 opposite to the side on which the diffusing lenses 64 cover the LEDs 61, and the protrusion length of the engaging portions 64a from the diffusing lenses 64 toward the heat sinks 63 is larger than the protrusion length of the positioning portions 64b from the diffusing lenses 64 toward the substrates 62. Thus, the diffusing lenses 64 can be easily mounted on the substrates 62 and the heat sinks 63 without employing an adhesive material or the like in a state where the diffusing lenses 64 are arranged at the prescribed positions on the substrates 62 to cover the LEDs 61.

According to the first embodiment, as hereinabove described, the pair of engaging portions 64a are provided on both sides of each of the diffusing lenses 64 in the direction (direction Z) intersecting with (orthogonal to) the extensional direction of the substrates 62, and the engaging portions 64a are configured to engage with the engaging holes 63d of the heat sinks 63. Furthermore, the pair of positioning portions 64b are provided on both sides of each of the diffusing lenses 64 in the extensional direction (direction X) of the substrates 62, and the positioning portions 64b are configured to come into contact with the positioning holes 62c of the substrates 62. Thus, the diffusing lenses 64 can be easily mounted on the heat sinks 63 by the pair of engaging portions 64a of each of the diffusing lenses 64. Furthermore, the diffusing lenses 64 can be easily positioned with respect to the LEDs 61 on the substrates 62 by the pair of positioning portions 64b of each of the diffusing lenses 64.

According to the first embodiment, as hereinabove described, the diffusing lenses 64 each are configured to engage with the engaging holes 63d of the heat sink 63 in the state where the pair of engaging portions 64a stride the substrate 62 along the direction (direction Z) intersecting with (orthogonal to) the extensional direction (direction X) of the substrate 62. Thus, the engaging portions 64a can be engaged with the engaging holes 63d of the heat sinks 63 supporting the substrates 62 without bringing the engaging portions 64a into contact with the substrates 62.

According to the first embodiment, as hereinabove described, the plurality of (sixteen in total) diffusing lenses 64 are provided and are arranged in the form of a row (linearly) at the prescribed intervals along the extensional direction (direction X) of the substrates 62. Thus, the time required to mount the diffusing lenses 64 can be effectively reduced even in the case where the plurality of diffusing lenses 64 are mounted on the substrates 62 and the heat sinks 63, and hence the mass production efficiency of the liquid crystal television set 100 can be improved.

Second Embodiment

The structure of a diffusing lens 164 according to a second embodiment of the present invention is now described with reference to FIGS. 12 to 15. In this second embodiment, an example of forming columnar portions 164c and hook portions 164d of engaging portions 164a to have an arcuate cross-section is described, unlike the aforementioned first embodiment in which the columnar portions 64c and the hook portions 64d of the engaging portions 64a are formed to have the rectangular cross-section. The engaging portions 164a are examples of the "first engaging portion" in the present invention.

Figure 12:
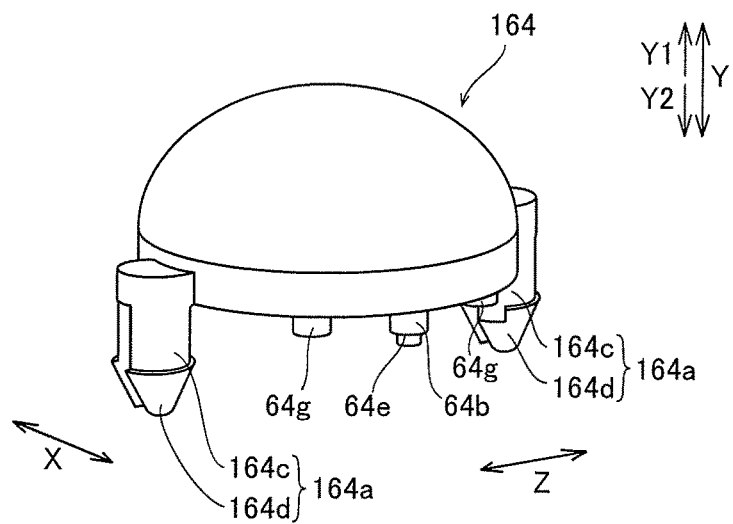
FIG. 12 A perspective view showing the overall structure of a diffusing lens according to a second embodiment.
Figure 13:
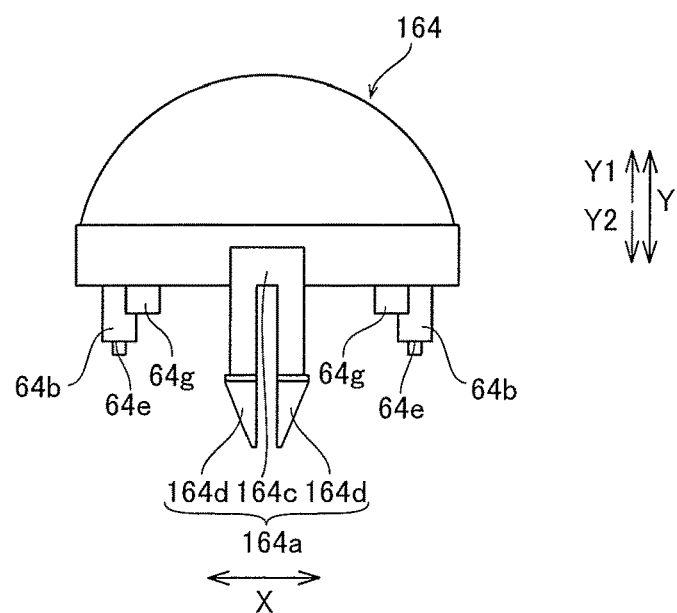
FIG. 13 A side elevational view of the diffusing lens shown in FIG. 12 as viewed in a direction Z.
Figure 14:
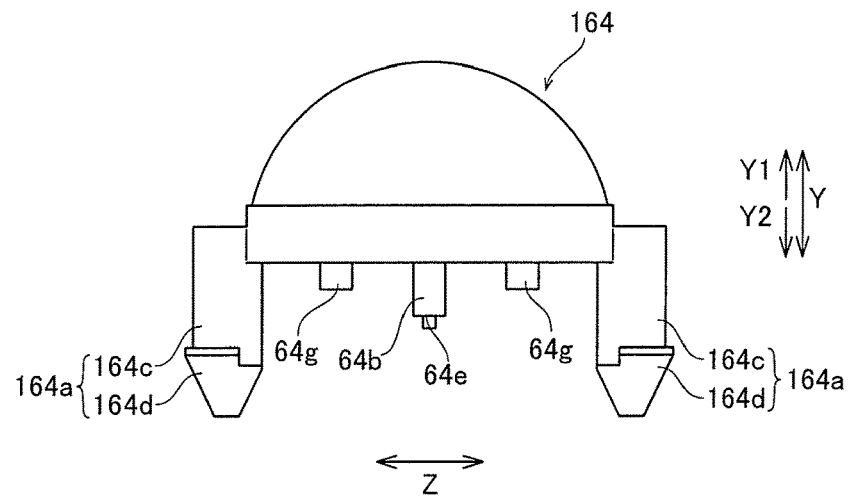
FIG. 14 A side elevational view of the diffusing lens shown in FIG. 12 as viewed in a direction X.
Figure 15:
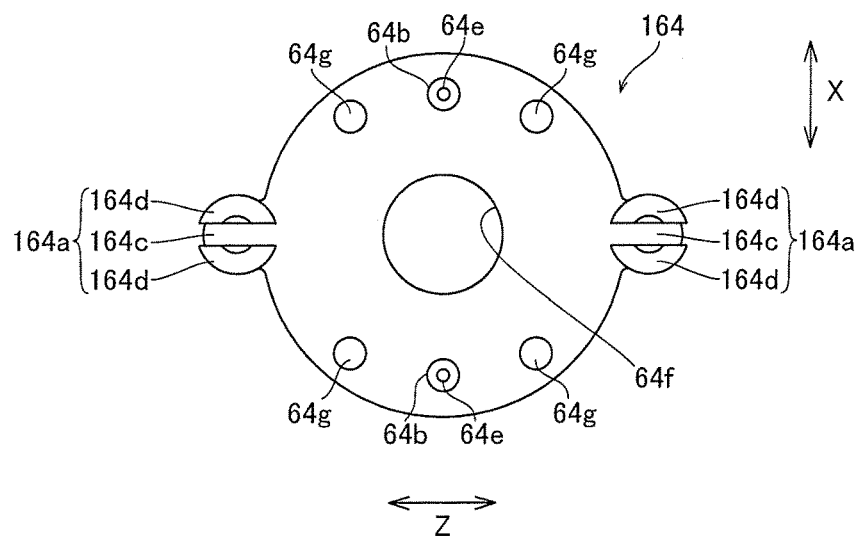
FIG. 15 A bottom plan view of the diffusing lens shown in FIG. 12 as viewed along arrow Y2.

According to the second embodiment, the engaging portions 164a of the diffusing lens 164 include the columnar portions 164c each having the arcuate cross-section, extending downward (in an arrow Y2 direction) from the diffusing lens 164 and the hook portions 164d each having the arcuate cross-section, provided on forward ends of the columnar portions 164c, as shown in FIGS. 12 to 14. As shown in FIGS. 12, 13, and 15, portions of the columnar portions 164c lower than the vicinity of the bottom surface (a surface on an arrow Y2 direction side) of the diffusing lens 164 are branched, and the hook portions 164d are provided one by one on each of the forward ends of these branched portions of the columnar portions 164c.

According to the second embodiment, the columnar portions 164c of the engaging portions 164a are formed to protrude outward from both ends of the diffusing lens 164 in a direction Z and extend parallel downward (in the arrow Y2 direction) from the protruding portions, as shown in FIGS. 12 to 14. The hook portions 164d of the engaging portions 164a are formed to taper downward from connection portions with the columnar portions 164c.

According to the second embodiment, a pair of engaging portions 164a are provided in the diffusing lens 164, similarly to the aforementioned first embodiment. As shown in FIG. 15, a direction (direction Z) in which the pair of engaging portions 164a are provided and a direction (direction X) in which a pair of positioning portions 64b provided separately from the pair of engaging portions 164a are provided intersect with (are orthogonal to) each other.

The remaining structure of the second embodiment is similar to that of the aforementioned first embodiment.

According to the second embodiment, as hereinabove described, the columnar portions 164c and the hook portions 164d of the engaging portions 164a each are formed to have the arcuate cross-section, whereby the strength of the engaging portions 164a can be further improved, as compared with the case where the columnar portions 164c and the hook portions 164d of the engaging portions 164a each are formed to have a rectangular cross-section.

The effects of the second embodiment are also similar to those of the aforementioned first embodiment.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

For example, while the example of applying the present invention to the liquid crystal television set has been shown in each of the aforementioned first and second embodiments, the present invention is not restricted to this. The present invention is applicable to a common display device such as a monitor for a PC (personal computer).

While the example of forming the uplift suppressing portions to have the columnar shape and providing the plurality of (four) columnar uplift suppressing portions to surround the holes of the diffusing lens has been shown in the aforementioned first embodiment, the present invention is not restricted to this. According to the present invention, a single uplift suppressing portion 264g may be provided in the form of a peripheral wall to surround the vicinity of a LED 61, as in a modification shown in FIGS. 16 and 17.

Figure 16:
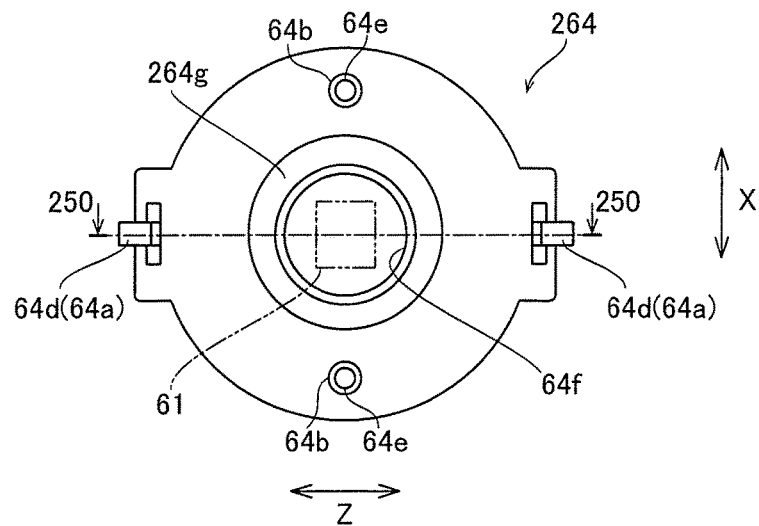
FIG. 16 A bottom plan view of a diffusing lens according to a modification of the first embodiment.
Figure 17:
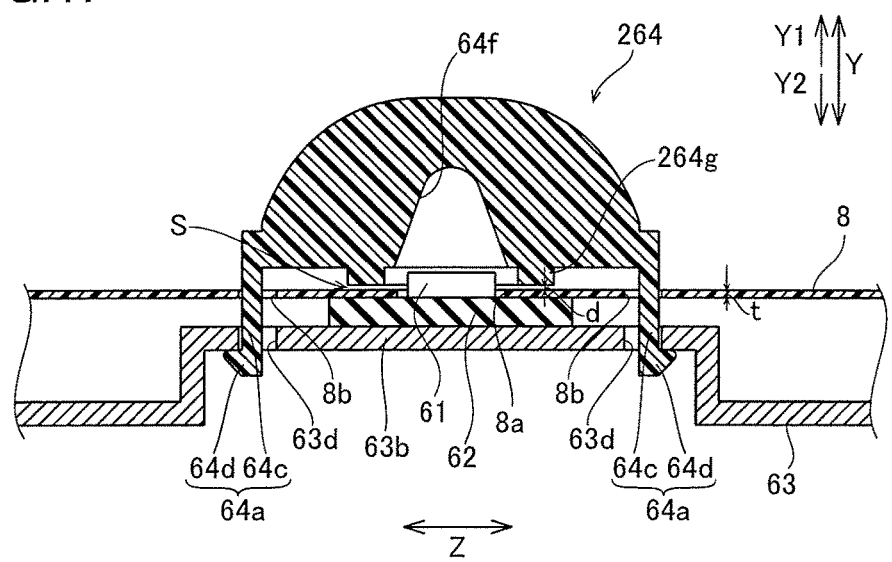
FIG. 17 A sectional view taken along the line 250-250 in FIG. 16.

According to the modification shown in FIGS. 16 and 17, a diffusing lens 264 integrally includes the single uplift suppressing portion 264g configured to suppress uplift of a portion of a reflective sheet 8 in the vicinity of the LED 61 from the side of a substrate 62 toward the diffusing lens 264. This uplift suppressing portion 264g is provided in the form of a peripheral wall surrounding the vicinity of the LED 61 in the form of a ring (annularly) and surrounding a hole 64f in a central portion of the bottom surface (a surface on an arrow Y2 direction side) of the diffusing lens 264 in the form of a ring (annularly). Furthermore, the uplift suppressing portion 264g is provided to surround the vicinity of the LED 61 in a state where a forward end (the lower surface on the arrow Y2 direction side) of the form of a peripheral wall protrudes toward the substrate 62 (Y2 side) beyond a light-emitting surface (a surface on an arrow Y1 direction side) of the LED 61. The remaining structure of the modification shown in FIGS. 16 and 17 is similar to that of the aforementioned first embodiment.

According to the modification shown in FIGS. 16 and 17, as hereinabove described, the uplift suppressing portion 264g is provided to surround the vicinity of the LED 61 in the form of a peripheral wall, whereby uplift of the reflective sheet 8 in the vicinity of the LED 61 can be effectively suppressed, and hence the amount of light reflected from the reflective sheet 8 can be effectively increased.

According to the modification shown in FIGS. 16 and 17, as hereinabove described, the uplift suppressing portion 264g is provided to surround the vicinity of the LED 61 in the state where the forward end of the form of a peripheral wall protrudes toward the substrate 62 beyond the light-emitting surface of the LED 61, whereby leakage of emission light from the light-emitting surface (the surface on the arrow Y1 direction side) of the LED 61 in the extensional transverse directions (a direction X and a direction Z) of the reflective sheet 8 can be suppressed, and the emission light can be efficiently emitted to a display portion 1 through the diffusing lens 264 directly above the light-emitting surface.

While the example of fixing the diffusing lenses to the substrates and the heat sinks by fitting the engaging portions (first engaging portion) and the positioning portions (first positioning portion) of the diffusing lenses into the engaging holes (second engaging portion) of the heat sinks and the positioning holes (second positioning portion) of the substrates for engagement, respectively has been shown in each of the aforementioned first and second embodiments, the present invention is not restricted to this. According to the present invention, the diffusing lenses may be fixed to the substrates and the heat sinks with an engagement structure other than the structure of fitting into the holes. Alternatively, according to the present invention, an engagement structure may not be employed to position the diffusing lenses.

While the example of providing the engaging holes corresponding to the engaging portions of the diffusing lenses in the heat sinks (supporting member, heat radiating member) and providing the positioning holes corresponding to the positioning portions of the diffusing lenses in the substrates (light-emitting element substrate) has been shown in each of the aforementioned first and second embodiments, the present invention is not restricted to this. According to the present invention, both the engaging holes and the positioning holes may be provided in the heat sinks, or both the engaging holes and the positioning holes may be provided in the substrates. Alternatively, according to the present invention, the engaging holes and the positioning holes may be provided in the rear frame (supporting member).

While the example of providing the pair of engaging portions and the pair of positioning portions in each of the diffusing lenses has been shown in each of the aforementioned first and second embodiments, the present invention is not restricted to this. According to the present invention, one engaging portion and one positioning portion may be provided in each of the diffusing lenses.

While the example of arranging the pair of engaging portions and the pair of positioning portions of each of the diffusing lenses in the directions intersecting with (orthogonal to) each other has been shown in each of the aforementioned first and second embodiments, the present invention is not restricted to this. According to the present invention, the pair of engaging portions and the pair of positioning portions of each of the diffusing lenses may be arranged in directions parallel to each other.

While the example of forming the engaging portions of the diffusing lenses to have the hook shape tapered as the engaging portions extend from the diffusing lenses toward the heat sinks has been shown in each of the aforementioned first and second embodiments, the present invention is not restricted to this. According to the present invention, the engaging portions of the diffusing lenses may be formed to extend parallel without tapering from the diffusing lenses toward the heat sinks.

While the example of providing the step portions on the forward ends of the positioning portions of the diffusing lenses closer to the substrates has been shown in each of the aforementioned first and second embodiments, the present invention is not restricted to this. According to the present invention, the step portions may not be provided on the forward ends of the positioning portions closer to the substrates, so far as the forward ends of the positioning portions closer to the substrates come into contact with the substrates.

REFERENCE NUMERALS

1: display portion
4: rear frame (supporting member)
8: reflective sheet
8a, 8b, 8c: hole
61: LED (light-emitting element)
62: substrate (light-emitting element substrate)
62a: mounting surface
62c: positioning hole (second positioning portion, second engaging hole)
63: heat sink (supporting member, heat radiating member)
63d: engaging hole (second engaging portion, first engaging hole)
64, 164, 264: diffusing lens
64a, 164a: engaging portion (first engaging portion)
64b: positioning portion (first positioning portion)
64e: step portion
64g, 264g: uplift suppressing portion
100: liquid crystal television set (display device)
S: clearance

The invention claimed is:
1. A display device comprising: a display portion; a light-emitting element emitting light to the display portion; a light-emitting element substrate mounted with the light-emitting element; a supporting member supporting the light-emitting element substrate; and a lens provided to cover the light-emitting element, diffusing the light from the light-emitting element, wherein the lens integrally includes a first engaging portion and a first positioning portion, the light-emitting element substrate includes a second positioning portion corresponding to the first positioning portion of the lens, the supporting member includes a second engaging portion corresponding to the first engaging portion, the first engaging portion and the first positioning portion are formed to protrude from the lens toward the supporting member and the light-emitting element substrate, respectively, the second engaging portion of the supporting member includes a first engaging hole which is provided outside the light-emitting element substrate in a short-side direction of the supporting member and into which the first engaging portion is fitted, the second positioning portion of the light-emitting element substrate includes a second engaging hole into which the first positioning portion of the lens is fitted, the first positioning portion of the lens is formed to protrude from a bottom surface of the lens toward the light-emitting element substrate and is formed to be fitted into the second engaging hole of the light-emitting element substrate, and a columnar portion of the first engaging portion of the lens is formed to protrude outward from both ends of the lens in the short-side direction of the supporting member and extend toward the supporting member outside the light-emitting element substrate, and is formed to be fitted into the first engaging hole of the supporting member.

2. The display device according to claim 1, wherein
a forward end of a projecting portion closer to the light-emitting element substrate and a reflective sheet are separated from each other with a clearance.

3. The display device according to claim 2, wherein
a separation distance of the clearance between the forward end of the projecting portion and the reflective sheet is not more than a thickness of the reflective sheet.

4. The display device according to claim 1, wherein
a plurality of projecting portions are provided, and
the plurality of projecting portions are arranged oppositely to each other about the light-emitting element in a plan view.

5. The display device according to claim 1, wherein
a projecting portion is provided in a form of a peripheral wall to surround a vicinity of the light-emitting element.

6. The display device according to claim 5, wherein
the projecting portion is provided to surround the vicinity of the light-emitting element in a state where a forward end of the peripheral wall protrudes toward the light-emitting element substrate beyond a light-emitting surface of the light-emitting element.

7. The display device according to claim 1, wherein
a reflective sheet includes holes in portions corresponding to a portion where the first engaging portion and the second engaging portion engage with each other and a portion where the first positioning portion and the second positioning portion contact each other.

8. The display device according to claim 7, wherein
the first positioning portion is formed in a columnar shape, and
a size of one of the holes in the reflective sheet corresponding to the portion where the first positioning portion and the second positioning portion contact each other is larger than a size of an outer shape of the first positioning portion in a plan view.

9. The display device according to claim 1, wherein a pair of first engaging portions and a pair of first positioning portions are provided in directions intersecting with each other.

10. The display device according to claim 1, wherein the first engaging portion has a hook-shaped portion that is tapered as the first engaging portion extends from the lens toward the supporting member.

11. The display device according to claim 1, wherein a step portion is provided . . . a mounting surface mounted with the light-emitting element, and
the first positioning portion is configured to serve as a positioning portion of the lens in a direction along the mounting surface and as a positioning portion of the lens in a direction intersecting with the mounting surface by being fitted into the second engaging hole in a state where the step portion and the light-emitting element substrate contact each other.

12. The display device according to claim 11, wherein the step portion of the first positioning portion has a bottom surface circumferentially contacting the mounting surface of the light-emitting element substrate.

13. The display device according to claim 11, wherein the lens is configured to be held on the mounting surface of the light-emitting element substrate in a state where the first engaging portion is fitted into the first engaging hole of the supporting member to engage with the supporting member and the first positioning portion is fitted into the second engaging hole of the light-emitting element substrate so that the step portion contacts the mounting surface.

14. The display device according to claim 1, wherein the supporting member is configured to support the light-emitting element substrate on a lower side of the light-emitting element substrate opposite to a side on which the lens covers the light-emitting element, and
a protrusion length of the first engaging portion from the lens toward the supporting member is larger than a protrusion length of the first positioning portion from the lens toward the light-emitting element substrate.

15. The display device according to claim 1, wherein the light-emitting element substrate is formed to extend along a prescribed direction,
a pair of first engaging portions are provided on both sides of the lens in a direction intersecting with an extensional direction of the light-emitting element substrate, a pair of second engaging portions are provided on the supporting member, and each one of the pair of first engaging portions is configured to engage with a corresponding one of the pair of second engaging portions of the supporting member, and
a pair of first positioning portions are provided on both sides of the lens in the extensional direction of the light-emitting element substrate, a pair of second positioning portions are provided on the light-emitting element substrate, and each one of the pair of first positioning portions is configured to contact a corresponding one of the pair of second positioning portions of the light-emitting element substrate.

16. The display device according to claim 15, wherein the lens is configured to engage with the second engaging portion of the supporting member in a state where the pair of first engaging portions stride the light-emitting element substrate along the direction intersecting with the extensional direction of the light-emitting element substrate.

17. The display device according to claim 15, wherein a plurality of the lenses are provided, and
the plurality of lenses are arranged in a form of a row at a prescribed interval along the prescribed direction in which the light-emitting element substrate extends.

18. The display device according to claim 1, wherein the supporting member includes a heat radiating member radiating heat transferred from the light-emitting element through the light-emitting element substrate.

19. An illumination device comprising: a light-emitting element emitting light; a light-emitting element substrate mounted with the light-emitting element; a supporting member supporting the light-emitting element substrate; and a lens provided to cover the light-emitting element, wherein the lens integrally includes a first engaging portion and a first positioning portion, the light-emitting element substrate includes a second positioning portion corresponding to the first positioning portion of the lens, the supporting member includes a second engaging portion corresponding to the first engaging portion, the first engaging portion and the first positioning portion are formed to protrude from the lens toward the supporting member and the light-emitting element substrate, respectively, the second engaging portion of the supporting member includes a first engaging hole which is provided outside the light-emitting element substrate in a short-side direction of the supporting member and into which the first engaging portion is fitted, the second positioning portion of the light-emitting element substrate includes a second engaging hole into which the first positioning portion of the lens is fitted, the first positioning portion of the lens is formed to protrude from a bottom surface of the lens toward the light-emitting element substrate and is formed to be fitted into the second engaging hole of the light-emitting element substrate, and a columnar portion of the first engaging portion of the lens is formed to protrude outward from both ends of the lens in the short-side direction of the supporting member and extend toward supporting member outside the light-emitting element substrate, and is formed to be fitted into the first engaging hole of the supporting member.

* * * * *